United States Patent [19]

Malkin

[11] Patent Number: 4,647,846
[45] Date of Patent: Mar. 3, 1987

[54] METHOD AND MEANS FOR TESTING MULTI-NODAL CIRCUITS

[76] Inventor: Dov B. Malkin, 1441 S. Oakhurst Dr., Los Angeles, Calif. 90035

[21] Appl. No.: 195,778

[22] Filed: Oct. 10, 1980

[51] Int. Cl.[4] ............................................. G01R 15/12
[52] U.S. Cl. ...................................... 324/73 R; 371/25
[58] Field of Search ....................... 324/73 R, 73 PC; 364/580; 371/25

[56] References Cited

U.S. PATENT DOCUMENTS 4,122,995  10/1978  Franke ............................. 324/73 R
4,271,515  6/1981  Axtell III ......................... 324/73 R Primary Examiner—Michael J. Tokar
Attorney, Agent, or Firm—A. Wasserman

[57] ABSTRACT

A method and means for testing a multi-nodal electronic circuit consist of comparing the signal at each node of the circuit under test which is excited by input signals with the signals at each node of a reference circuit which is excited by the same input signals, and terminates by an equal load as that of the circuit under test. Signals are forced from nodes of one of the two circuits to corresponding nodes of the other circuit whenever the signals at corresponding nodes are not the same. Only nodes in the circuit under test, which are connected to faulty components or faulty wiring, draw or supply current, to or from the reference circuit, a fact which is indicated and/or recorded thereby identifying the faulty portions of the circuit under test.

6 Claims, 3 Drawing Figures

METHOD AND MEANS FOR TESTING MULTI-NODAL CIRCUITS

BACKGROUND OF THE INVENTION

1. Field of the Invention

The present invention generally relates to circuit testing and, more particularly, to a method and means for testing and analysing the performance of electronic circuitry of different integration sizes and types.

2. Description of the Prior Art

In the production and use of circuits of the same design, hereafter referred to as identical circuits, which may be electrical, digital or analog or different integration sizes and either in dynamic or static states, testing of every or most of the produced circuits is either required or highly desirable. To this end various automatic test equipment (ATE) have been developed. An ATE typically includes a source of electrical stimuli, e.g. a source of input signals, which are applied to each circuit to be tested, hereafter referred to by the acronym UUT, for unit under test. Also included in the ATE are devices which measure the output signals from the UUT, as well as some signals at junction points or nodes of the UUT. A computer, either a special purpose computer or a properly programmed general purpose computer is also included. The measured signals are fed to the computer, wherein various information, pertaining to input-output ratios and allowed tolerances are stored. The computer, by means of its processor unit, controls the stimulation and measurements' sequences, as well as, other sequences, to determine whether or not the UUT operates satisfactorily and the location of malfunctions, if any.

Before testing the various identical circuits of a set of circuits, an extensive study or analysis of the basic circuit must take place. The analysis involves predicting expected circuit outputs for specified inputs, and an analysis of unexpected outputs at the circuit's output terminals and at intermediate nodes, as a result of one or more faulty components. Such analysis, which is time consuming, may dictate the testing of the circuit by applying additional inputs and measuring additional outputs.

Such an ATE is quite expensive. Also, the testing of each UUT is quite time consuming, particularly when the circuit is of any level of complexity and includes a reasonably large number of nodes. A need therefore exists for a new method and means for expediting and simplifying the testing of circuits.

OBJECTS AND SUMMARY OF THE INVENTION

It is a primary object of the present invention to provide a new, relatively simple, arrangement for testing multi-nodal circuits.

Another object of the present invention is to provide means for testing multi-nodal circuits speedily and without the limitations and disadvantages, characteristic of the prior art.

A further object of the invention is to provide a new method for testing multi-nodal circuits.

These and other objects of the invention are achieved by providing a master circuit unit hereafter referred to as the KGU, for known good unit, which is used when testing each UUT. The KGU is one which is known to operate satisfactorily. The operation of each UUT is compared to that of the KGU. In operation both the KGU and the UUT are terminated by equal loads and are excited by the same input signals. While both units are excited, the signals at corresponding nodes of the two units are compared. If the UUT operates satisfactorily, the signals at each of its nodes is the same as that at the corresponding node of the KGU. On the other hand, if the UUT is faulty, either due to a faulty component or faulty wiring, the signals at one or more pairs of corresponding nodes of the two units are not the same. In such a case the node of the UUT is deemed to be a faulty or bad node. As used hereinafter, including the claims, the signals at corresponding nodes are deemed to be the same as long as the difference between them does not exceed acceptable tolerances.

As will be pointed hereafter, a bad node may be an essential bad node or non-essential bad node. An essential bad node is defined as one connected to a faulty component or wiring, while a non-essential bad node is one at which fault-indicating signal is present, not because the node is connected to a faulty component or wiring, but rather because the node is supplied with a faulty signal from interconnected circuitry.

In accordance with the present invention, corresponding nodes may be examined sequentially or simultaneously. Also wherever the signals at two corresponding nodes differ, signal forcing may take place in order to distinguish between essential and non-essential bad nodes. Once all essential bad nodes have been determined the UUT is examined to determine the faulty components or wiring.

DETAILED DESCRIPTION OF THE PREFERRED EMBODIMENTS

Figure 1:
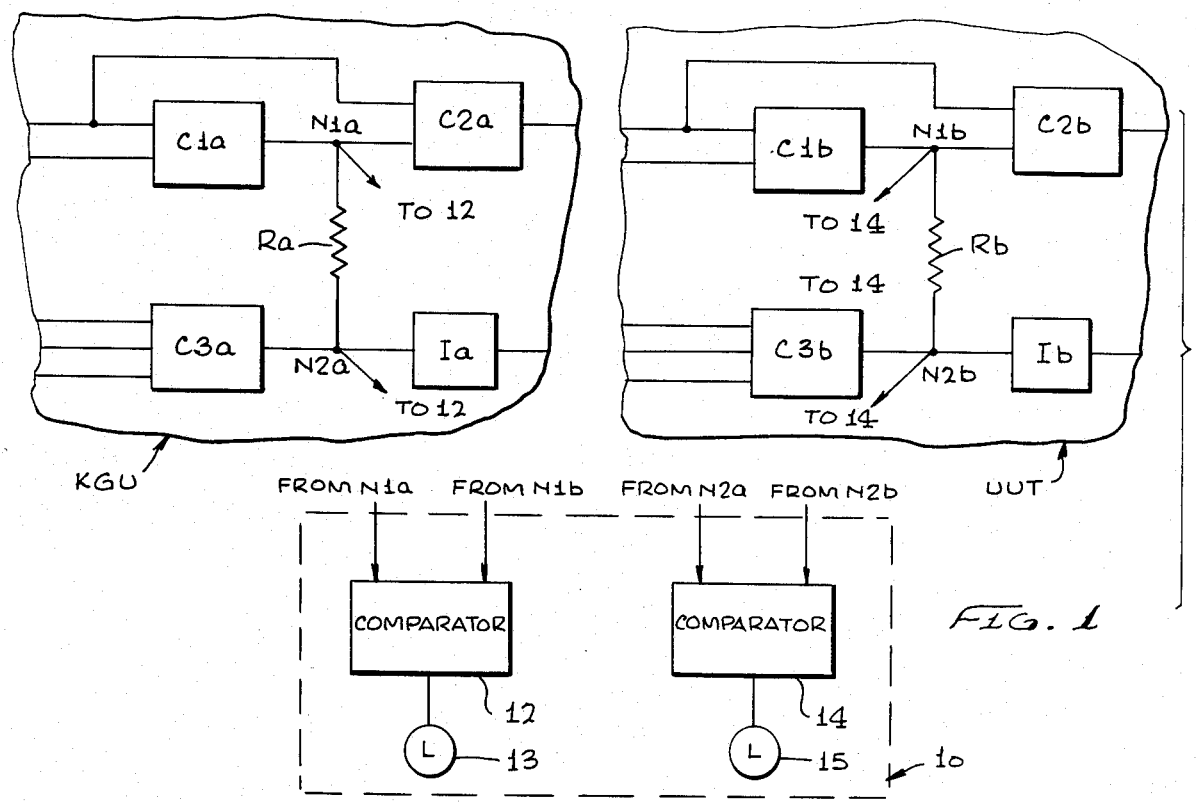
FIG. 1 is a simple diagram useful in explaining the basic principles of the invention.

Attention is first directed to FIG. 1 in connection with which the basic principles of the invention will be described. Therein a KGU and a UUT are shown. Each is shown comprising multi-input components C1, C2 and C3, an inverter I and a resistor R, and two nodes N1 and N2. For explanatory purposes, in the KGU the foregoing are designated by the subscript a and in the UUT by the subscript b.

Also shown is a test unit 10, which for explanatory purposes is assumed to include a comparator 12 to which corresponding nodes $N1_a$ and $N1_b$ are connected. Connected to comparator 12 is an indicator or light 13. Likewise, nodes $N2_a$ and $N2_b$ are connected to a comparator 14 to which is connected to a light 15. For explanatory purposes, each comparator is assumed to activate its associated light 13 thereby indicate a fault signal, when its two inputs are not the same.

A node in UUT is assumed to be a good node if the signal thereat is the same, as that at the corresponding node in the KGU. A node in UUT is assumed to be a bad or a faulty node if the signal thereat differs from that at the corresponding KGU node. It should thus be appreciated that in the arrangement shown in FIG. 1, if each of nodes $N1_b$ and $N2_b$ is a good one both lights 13 and 15 will be off. However, if node $N1_b$ is bad i.e. the signal level thereat differs from that at node $N1_a$ comparator 12 will activate light 13, thereby indicating that node $N1_b$ is bad.

If desired, a single comparator and indicator, such a light, may be used and all nodes may be tested sequentially. Alternately, a comparator indicator set may be provided for each pair of corresponding nodes in the KGU & UUT, so that all the nodes of the UUT may be tested, simultaneously.

The presence of even a single bad node in the UUT indicates that the UUT is a faulty one. A node may be a bad one for one of two reasons. It may be connected to a faulty component or wiring, causing the connected node to assume a wrong value or signal. Such a node was herebefore defined as an essential bad node. A node may also be a bad one if, due to another node a wrong signal value propogates to the former. Such a node is defined as a non-essential bad node. It is highly desirable to be able to distinguish between non-essential and essential bad nodes, since only the components connected to the essential bad nodes need close inspection and possible replacement.

Figure 2:
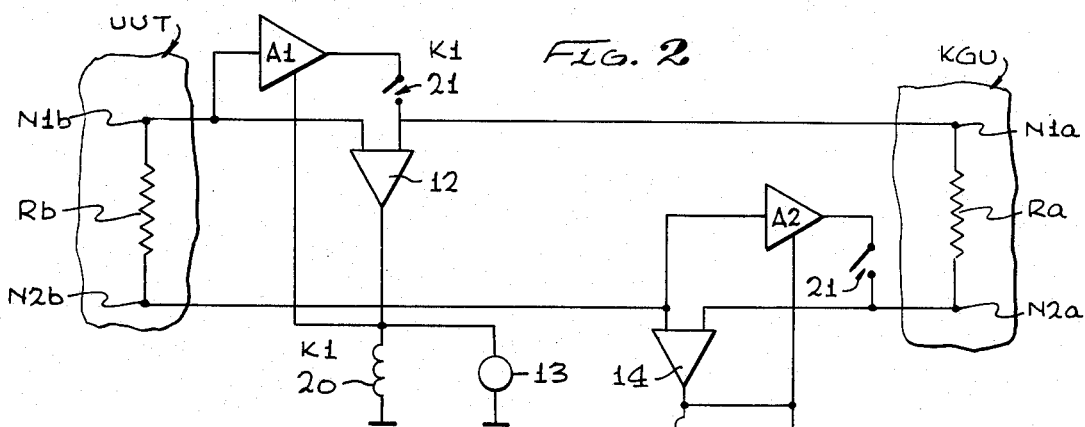
FIGS. 2 and 3 are diagrams useful in explaining two embodiments of the invention.

In accordance with the present invention, means and a method are provided to provide such a capability. This aspect may best be described in connection with FIG. 2, wherein only the two nodes N1 and N2 and the resistor R of each of KGU & UUT, are shown. As shown in FIG. 2, in addition to comparator 12 and light 13, also associated with corresponding nodes $N1_a$ and $N1_b$ are a relay K1, which includes a coil 20 and contacts 21, and a driver A1. Likewise, a relay K2 with its coil 20 and contacts 21 and a driver A2, are associated with corresponding nodes $N2_a$ and $N2_b$.

If node $N1_b$ of the UUT is bad i.e. if the difference between the signal thereat and that at node $N1_a$ is more than an allowed tolerance, comparator 12 will energize the indicator or light 13, and in addition will energize relay K1, by energizing its coil 20, thereby closing contacts 21 of K1. Thus, driver A1 will force node $N1_a$ to assume the signal value at $N1_b$. Suppose node $N2_b$ is a non-essential bad node and that the error at node $N1_b$ is propagated to node $N2_b$. Thus, initially the signals at $N2_a$ and $N2_b$ will differ, causing relay K2 to close and thereby, via driver A2, force node $N2_a$ to assume the value of $N2_b$. Once, however, node $N1_a$ assumes the value of $N1_b$ by having been forced thereto, a signal, whose level is the same as that at node $N2_b$, will be supplied to node $N2_a$. Thus, nodes $N2_a$ and $N2_b$ will have the same signal values. Consequently, comparator 14 will no longer activate indicator 15 or relay K2. Consequently, the contacts of K2 will open and node $N2_a$ will no longer be driven to assume the value at $N2_a$.

From the foregoing, it should be apparent that as to each non-essential bad node, once it receives the proper signal it no longer needs to be forced by its corresponding node. However, an essential bad node need be forced continuously. Thus, in the embodiment shown in FIG. 2, once a relay closes and thereafter the comparator is provided with the same signals from the pair of corresponding nodes, the relay remains closed for a brief period. If the node is a non-essential bad node, little if any current is forced by the driver, which may be connected via line L to the relay coil 20 and to the indicator. In such a case, the relay is then opened and the indicator is not energized. On the other hand, if the node is an essential bad node the two signals to the comparator are the same only because the node is forced by the current from the driver. Thus, in such a case even though the two signals to the comparator are the same, the driver supplying a forcing current maintains the relay closed and energizes the indicator via the connecting line L.

If desired, whenever a driver provides a forcing current of any level, the relay may remain closed and the indicator instead of an illuminator or light may be of the type which would indicate the amount of forcing current, or the like, needed to insure that the two signals at the pair of corresponding nodes are the same, i.e. equal. Such an embodiment may provide further information as to variations between essential bad nodes or non-essential bad nodes.

Figure 3:
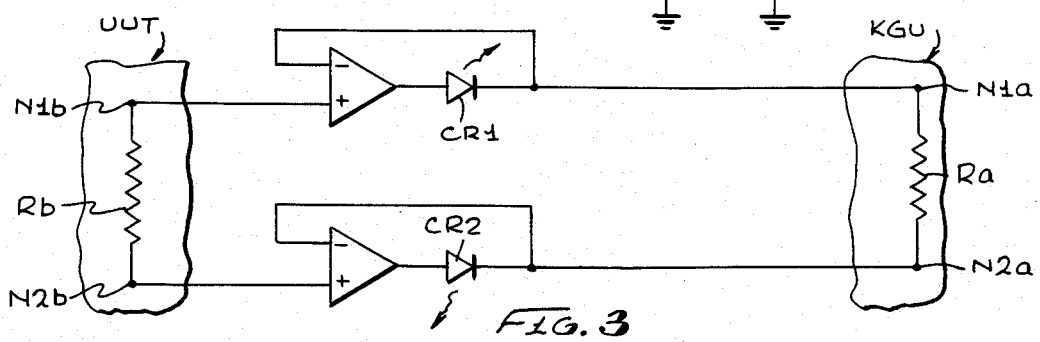

A variation on this approach is shown in FIG. 3. In this arrangement all the nodes, whether good or bad, of KGU are forced to the values of the nodes of the UUT. However, only the essential bad nodes will need an appreciable amount of current to insure the forcing action. Once equal signals are supplied to the prior non-essential bad nodes they will no longer be drawing sufficient current to activate a fault indicator such as light emitting diodes, e.g. CR1, CR2 to emit light. Thus, only the diodes which emit light would indicate that the nodes associated with them are essential bad nodes.

Heretofore, it was assumed that nodes of the KGU are forced to the values of their corresponding nodes in the UUT. This is a preferrable assignment since the master KGU can be easily designed to quickly absorb and withstand the forcing current without damage thereto. However, if desired, the KGU may be used as the forcing source.

In either case it is apparent that in accordance with the present invention as each UUT is tested, an indication is provided of every essential bad node i.e. a node connected to a faulty component or wiring so that a defective signal level is produced at the node. If desired, in place of, or in addition to illuminating a light, associated with each bad node, determined to be essential, the locations of all essential bad nodes may be recorded automatically, and the record attached to the tested UUT for subsequent repair.

From the foregoing, it should thus be appreciated that in accordance with one aspect of the invention, the signals at any selected or all nodes of a UUT are compared with the signals at corresponding nodes of a KGU. If the signals at any pair of corresponding nodes are not the same, an indication is provided thereby indicating the node in the UUT to be a potentially bad node. In preferred embodiments of the invention, in order to distinguish between essential and non-essential bad nodes, only the latter requiring special attention, signal or current forcing takes place, to force all the bad nodes, to assume the proper signal levels. By such forcing, non-essential bad nodes become good nodes, with a minimum of any current being drawn to such nodes. Thus, at the end of the test, which requires a minimum of time, only the essential bad nodes are identified.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A method of testing a multi-nodal circuit, the steps comprising:
   providing a multi-nodal reference circuit, whose performance is known to be good and to be used as a reference for the performance of the circuit under test which circuit wire is essentially identical with the reference circuit;

interconnecting corresponding nodes of the reference circuit and the circuit under test to test circuitry;

operating both circuits under the identical conditions;

comparing the signals at corresponding nodes; and providing an indication for each pair of corresponding nodes at which the signals differ from one another, thereby indicating the node of the circuit under test to be a faulty node wherein the method further includes the step of forcing each node of one of the circuits, at which the signal differs from that of the corresponding node in the other circuit to assume the value of the signal at the node of the other circuit.

2. A method of testing a multi-nodal circuit as described in claim 1 wherein an indication is provided of the the amount of forcing required to maintain equal signals at each pair of corresponding nodes in said circuits.

3. A testing arrangement for testing a multi-nodal circuit, definable as a test circuit by comparing its operation with that of a similar reference circuit, the arrangement comprising:

first means connected to corresponding nodes of said test circuit and said reference circuit for comparing the signals at each pair of corresponding nodes and for providing a fault signal for each pair of corresponding nodes whereat the signals are different from one another; and providing an indication for each pair of corresponding nodes, whereat the signals are different from one another and further including means for forcing each node of one of said circuits at which the signals differ from that of the corresponding node of the other circuit, to assume the signal at the node of said other circuit.

4. A method of testing a multi-nodal circuit as described in claim 3 wherein said means for forcing comprises a relay and a driver, and means for connecting said driver between corresponding nodes only when said relay is activated by said fault signal.

5. A method of testing a multi-nodal circuit as described in claim 4 wherein said means for forcing comprises a driver and an indicator serially connected between each pair of corresponding nodes with said driver forcing any nodes having different signals to be driven to have equal signals and said indicator providing an indication of the force needed to drive the corresponding node to have equal signals.

6. In a method of testing a multi-nodal circuit against a reference circuit by operating both circuits simultaneously under the same conditions and comparing the signals at corresponding nodes of the two circuits, the steps comprising:

forcing corresponding nodes at which different signals are present to be driven to have equal signals; and providing an indication of each pair of corresponding nodes whereat forcing takes place.

* * * * *